(12) United States Patent
Yudasaka

(10) Patent No.: US 7,524,734 B2
(45) Date of Patent: Apr. 28, 2009

(54) WIRING SUBSTRATE, ELECTRO-OPTIC DEVICE, ELECTRIC APPARATUS, METHOD OF MANUFACTURING WIRING SUBSTRATE, METHOD OF MANUFACTURING ELECTRO-OPTIC DEVICE, AND METHOD OF MANUFACTURING ELECTRIC APPARATUS

(75) Inventor: Ichio Yudasaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 202 days.

(21) Appl. No.: 11/423,066

(22) Filed: Jun. 8, 2006

(65) Prior Publication Data

US 2007/0023899 A1 Feb. 1, 2007

(30) Foreign Application Priority Data

Jul. 28, 2005 (JP) .............................. 2005-219093

(51) Int. Cl.
*H01L 21/76* (2006.01)
*H01L 21/4763* (2006.01)
(52) U.S. Cl. ...................................... 438/421; 438/619
(58) Field of Classification Search ......... 438/421–422, 438/619, 704
See application file for complete search history.

(56) References Cited

U.S. PATENT DOCUMENTS

| 7,105,420 B1 * | 9/2006 | Chan et al. ................... 438/422 |
| 7,173,319 B2 | 2/2007 | Iwamatsu et al. |
| 7,352,049 B2 | 4/2008 | Iwamatsu et al. |
| 7,453,135 B2 | 11/2008 | Iwamatsu et al. |
| 2003/0001222 A1 | 1/2003 | Street et al. |
| 2003/0141561 A1 | 7/2003 | Fischer et al. |
| 2005/0170670 A1 * | 8/2005 | King et al. ................... 438/800 |
| 2008/0042237 A1 | 2/2008 | Iwamatsu et al. |

FOREIGN PATENT DOCUMENTS

| DE | 199 58 311 A 1 | 6/2001 |
| JP | A 06-029321 | 2/1994 |
| JP | A-08-045838 | 2/1996 |
| JP | A 10-012722 | 1/1998 |
| JP | A 2001-144276 | 5/2001 |
| JP | A 2001-217312 | 8/2001 |
| JP | A-2005-183686 | 7/2005 |
| WO | WO 01/80286 A2 | 10/2001 |

* cited by examiner

*Primary Examiner*—Cuong Q Nguyen
(74) *Attorney, Agent, or Firm*—Oliff & Berridge, PLC

(57) ABSTRACT

A wiring substrate includes a substrate, a first film, and a second film formed between the substrate and the first film, and an empty space is formed between at least a part of the second film and the substrate.

11 Claims, 12 Drawing Sheets

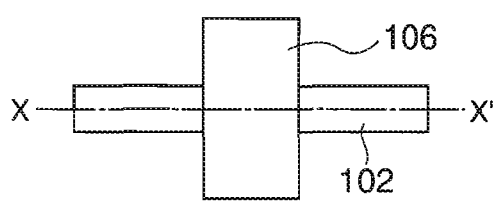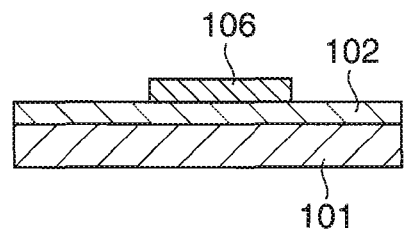
FIG. 2A　　　　　　　FIG. 2B
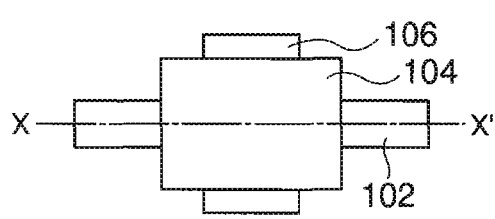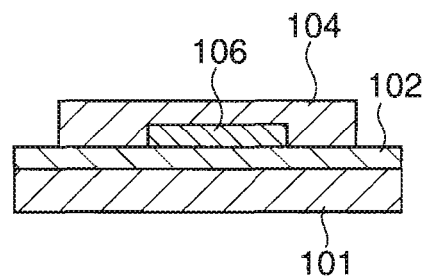
FIG. 2C　　　　　　　FIG. 2D
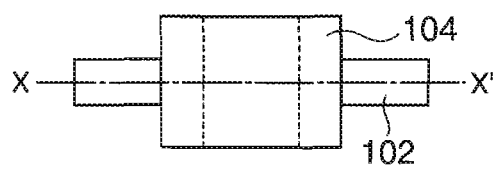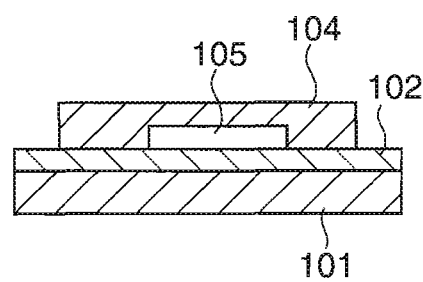
FIG. 2E　　　　　　　FIG. 2F
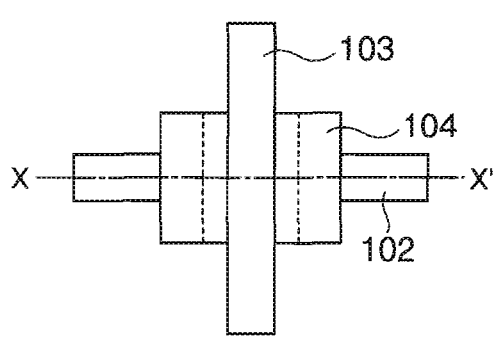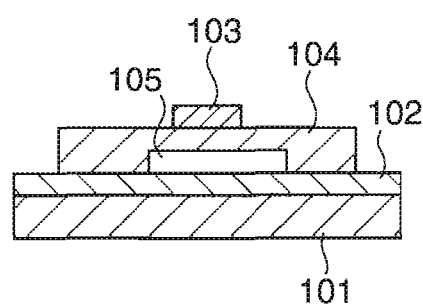
FIG. 2G　　　　　　　FIG. 2H

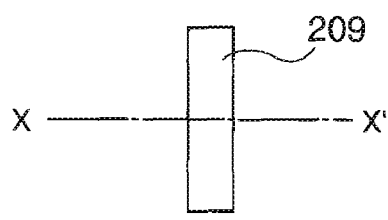
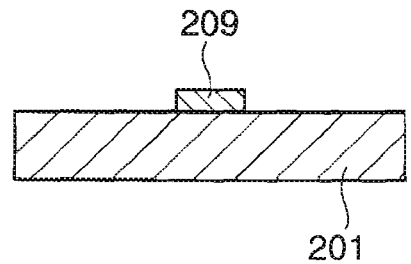
FIG. 8A  FIG. 8B
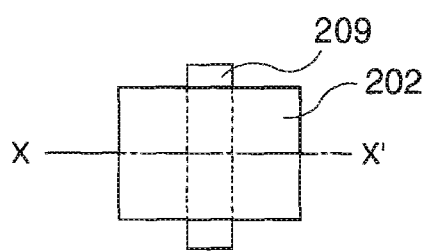
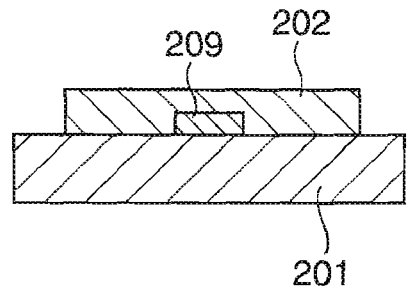
FIG. 8C  FIG. 8D
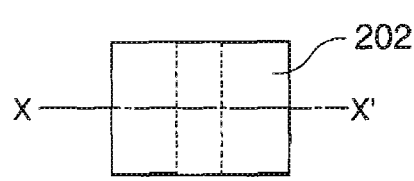
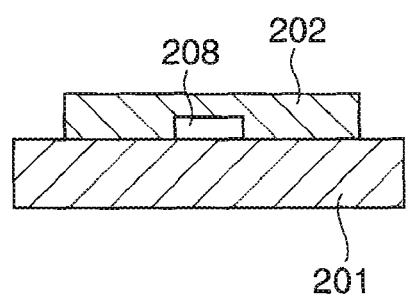
FIG. 8E  FIG. 8F
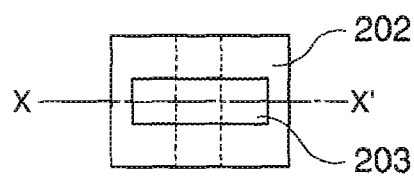
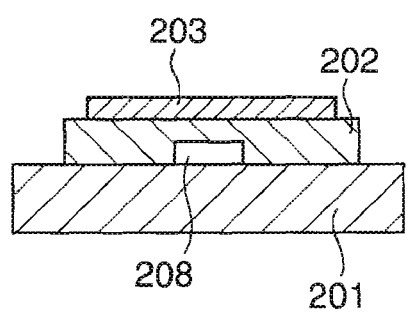
FIG. 8G  FIG. 8H

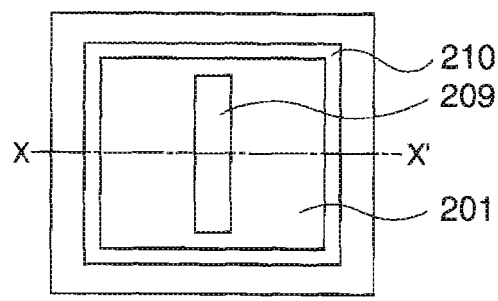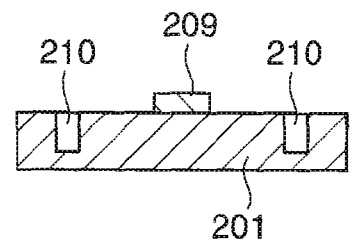
FIG. 11A  FIG. 11B
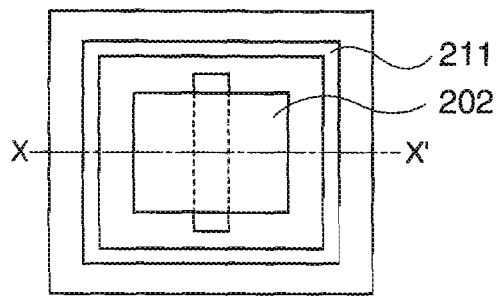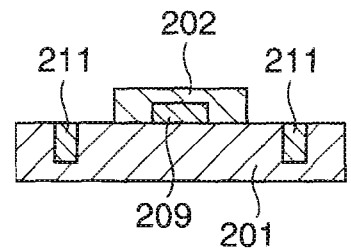
FIG. 11C  FIG. 11D
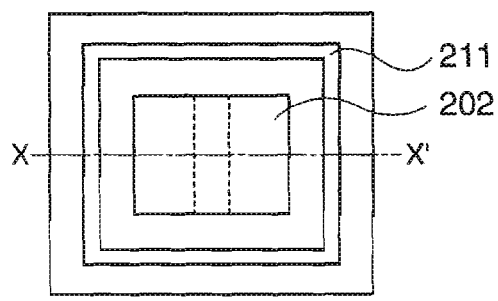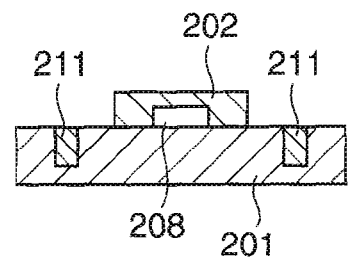
FIG. 11E  FIG. 11F
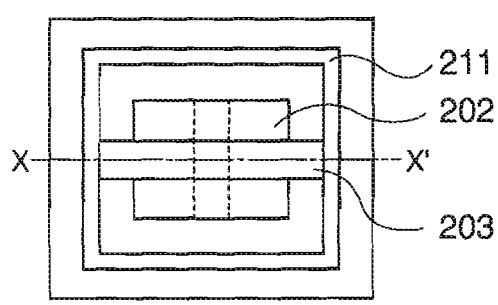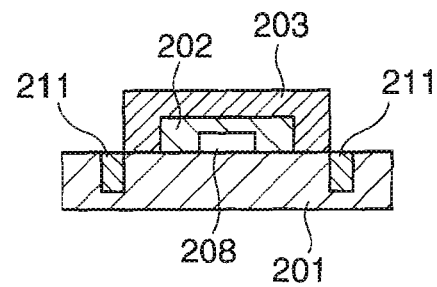
FIG. 11G  FIG. 11H

WIRING SUBSTRATE, ELECTRO-OPTIC DEVICE, ELECTRIC APPARATUS, METHOD OF MANUFACTURING WIRING SUBSTRATE, METHOD OF MANUFACTURING ELECTRO-OPTIC DEVICE, AND METHOD OF MANUFACTURING ELECTRIC APPARATUS

BACKGROUND OF THE INVENTION

1. Technical Field

The present invention relates to a wiring substrate, an electro-optic device, an electric apparatus, a method of manufacturing a wiring substrate, a method of manufacturing an electro-optic device, and a method of manufacturing an electric apparatus.

2. Related Art

In a wiring substrate of a semiconductor device having a multilayer wiring structure or the like, conductors or a semiconductor and a conductor need to be isolated from each other in areas where they overlap. As a method of isolation, a method of providing an insulating film with low permittivity or a method of forming an empty space (SON: Silicon on Nothing) is known. In particular, the empty space can increase the insulation performance.

A technology for utilizing the empty space as the isolation area with low permittivity is described in, for example, JP-A-2001-144276 or JP-A-2001-217312.

However, the technology for forming a hollow area between films as, for example, the SON in the past, is apt to require complicated process, in general.

SUMMARY

In view of the technical problem, an advantage of the invention is to improve insulating performance between films formed on a wiring substrate having a multi layer wiring structure without complicating the manufacturing process.

A wiring substrate according to an aspect of the invention includes a substrate, a first film, and a second film formed between the substrate and the first film, and an empty space is formed between at least a part of the second film and the substrate.

Further, in the wiring substrate according to the aspect of the invention, at least a part of the second film has contact with the substrate, and a part of the first film positions above the empty space. Further, the second film preferably includes an insulating material. Thus, the insulating performance between the substrate and the first film can be improved.

Further, in the wiring substrate described above, the first film can include a semiconductor material, a gate insulating film can be formed on the first film, and a gate electrode can be formed on the gate insulating film. Thus, the insulating performance between the substrate and the semiconductor film can be improved in a so-called top gate type transistor.

Further, in the wiring substrate described above, the first film can include a first conductive material. Note here that the conductive material includes a metallic material and a conductive organic material. For example, by forming the gate electrode with the first film, it can be applied to a so-called bottom gate type transistor.

Further, in the wiring substrate described above, the substrate can have a third film including a second conductive material, and at least a part of the second film and at least a part of the empty space can be formed above the third film. Thus, assuming that the first film and the third film are wiring patterns, for example, the insulating performance between the both wiring patterns can be improved.

Further, in the wiring substrate described above the substrate can include a single crystal semiconductor substrate. Thus, assuming that the substrate is a silicon wafer, for example, it can be applied to a semiconductor device formed on a silicon wafer.

Further, the substrate can include an insulating substrate. Thus, assuming that the substrate is a glass substrate, for example, it can be applied to a semiconductor device formed on a glass substrate.

The wiring substrate according to the above aspect of the invention can be applied to an electro-optic device or an electric apparatus as other aspects on the invention. Note here that an electro-optic device denotes a device equipped with, for example, a liquid crystal element, an electrophoretic element including dispersion medium dispersing electrophoretic particles, an EL element or the like, and applying the wiring substrate described above as a drive circuit or the like. Further, an electric apparatus denotes a general instrument offering a certain function and equipped with the wiring substrate according to the invention, and is composed of, for example, an electro-optic device or a memory. The configuration thereof is not particularly limited, and for example, an IC card, a cellular phone, a video camera, a personal computer, a head mount display, a rear type or a front type of video projector, a facsimile machine having a display function, a view finder of a digital still camera, a portable TV, a DSP device, a PDA, an electronic organizer, an electric bulletin board, an advertising display and so on can be included.

A method of manufacturing a wiring substrate according to another aspect of the invention includes the step of forming a removable film on a substrate, the step of forming an insulating film covering the removable film, and the step of forming an empty space between the substrate and the insulating film by removing the removable film so that a part of the insulating film has contact with the substrate. Further, by including the step of forming a conductive film on the insulating film, and arranging that a part of the conductive film positions above the empty space, the insulating performance between the substrate and the conductive film can be improved.

Further, by including the step of forming a semiconductor film on the insulating film, and arranging that a part of the semiconductor film positions above the empty space, the insulating performance between the substrate and the semiconductor film can be improved.

Further, the step of removing the removable film can include the step of dipping the removable film in a remover liquid.

The method of manufacturing a wiring substrate according to the above aspect of the invention can be applied to a method of manufacturing an electro-optic device or a method of manufacturing an electric apparatus as other aspects on the invention. Note here that an electro-optic device denotes a device equipped with, for example, a liquid crystal element, an electrophoretic element including dispersion medium dispersing electrophoretic particles, an EL element or the like, and applying the wiring substrate described above as a drive circuit or the like. Further, an electric apparatus denotes a general instrument offering a certain function and equipped with the wiring substrate according to the invention, and is composed of, for example, an electro-optic device or a memory. The configuration thereof is not particularly limited, and for example, an IC card, a cellular phone, a video camera, a personal computer, a head mount display, a rear type or a front type of video projector, a facsimile machine having a display function, a view finder of a digital still camera, a portable TV, a DSP device, a PDA, an electronic organizer, an electric bulletin board, an advertising display and so on can be included.

BRIEF DESCRIPTION OF THE DRAWINGS

The invention will now be described with reference to the accompanying drawings, wherein like numbers refer to like elements.

FIGS. 2A through 2H are views for explaining a method of manufacturing the wiring substrate according to an embodiment of the invention.

FIGS. 8A through 8H are views for explaining a method of manufacturing a transistor applying the wiring substrate according to an embodiment of the invention.

FIGS. 11A through 11H are views for explaining a method of manufacturing a transistor applying the wiring substrate according to an embodiment of the invention.

DESCRIPTION OF THE EMBODIMENTS

Embodiments of the invention will hereinafter be described with reference to the accompanying drawings.

First Embodiment

Figure 1A:
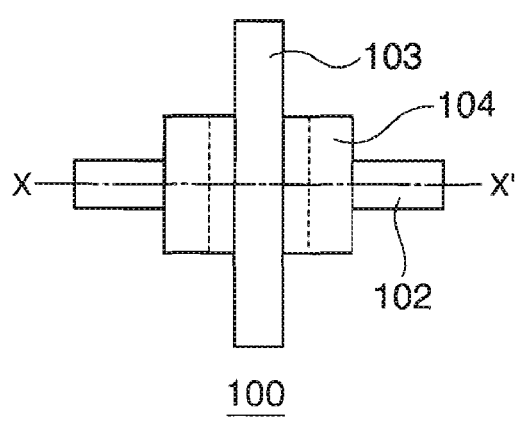
FIG. 1A is a top view of a wiring substrate according to an embodiment of the invention.
Figure 1B:
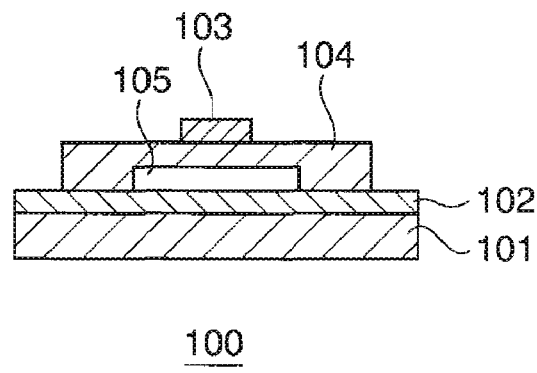
FIG. 1B is a cross-sectional view along the X-X'line in FIG. 1A.

FIGS. 1A and 1B are views schematically showing the structure of a wiring substrate 100 according to a first embodiment of the invention. FIG. 1A is a top view of the wiring substrate 100, and FIG. 1B is a cross-sectional view along the X-X' line in FIG. 1A. The wiring substrate 100 is provided with a substrate (base body) 101, first wiring (a third film) 102, a second wiring (a first film) 103, an insulating film (a second film) 104 formed between the first wiring 102 and the second wiring 103. The insulating film 104 has a hollow section, namely an empty space 105 is formed between the first wiring 102 and the insulating film 104.

Then, a manufacturing process of the wiring substrate 100 will be explained with reference to FIGS. 2A through 2H. FIGS. 2A, 2C, 2E and 2G are top views of the wiring substrate 100, and FIGS. 2B, 2D, 2F and 2H are cross-sectional views along the respective X-X' lines in FIGS. 2A, 2C, 2E and 2G.

Firstly, as shown in FIGS. 2A and 2B, a resist (removable film) 106 is formed on the first wiring 102 formed on the substrate 101 and in an area where the first wiring 102 and the second wiring 103 intersect. A photo resist made of, for example, novolak type resin can be used as the resist 106. The resist 106 is formed to have a thickness in a range of about several hundred nanometers through one micrometer. Note that, by irradiating with UV light in vacuum while heating at a temperature in a range of about 100 through 130° C. after patterning the resist 106, the heat resistance of the resist 106 can be improved, thus the resist can be prevented form deforming or decreasing in volume against a heat treatment up to about 300 through 400° C.

Subsequently, as shown in FIGS. 2C and 2D, the insulating film 104 is formed on the resist 106 by a coating process. In this case, as shown in FIG. 2C, the insulating film 104 is formed so that the both ends of the resist 106 are partially exposed. The insulating film 104 is formed by, for example, applying polysilazane on the substrate with a spin coat method, and then calcining it at a temperature in a range of 300 through 400° C. for about an hour in an oxygen or moisture environment.

Subsequently, as shown in FIGS. 2E and 2F, the resist 106 is removed using a resist remover liquid to form the empty space 105. The resist remover liquid enters also a part under the insulating film 104, while solving the resist 106 not covered with the insulating film 104, to completely remove the resist 106. As shown in FIG. 2C, since the both ends of the resist 106 are arranged to be partially exposed from the insulating film 104, the empty space 105 has a structure having ports in directions along one axis like a tunnel.

Subsequently, as shown in FIGS. 2G and 2H, the second wiring 103 is formed on the insulating film 104. As shown in FIG. 2H, a double layer structure composed of the insulating film 104 and the empty space 105 is formed between the first wiring 102 and the second wiring 103, thus reducing the dielectric constant, and at the same time, enhancing the insulation performance.

Figure 3A:
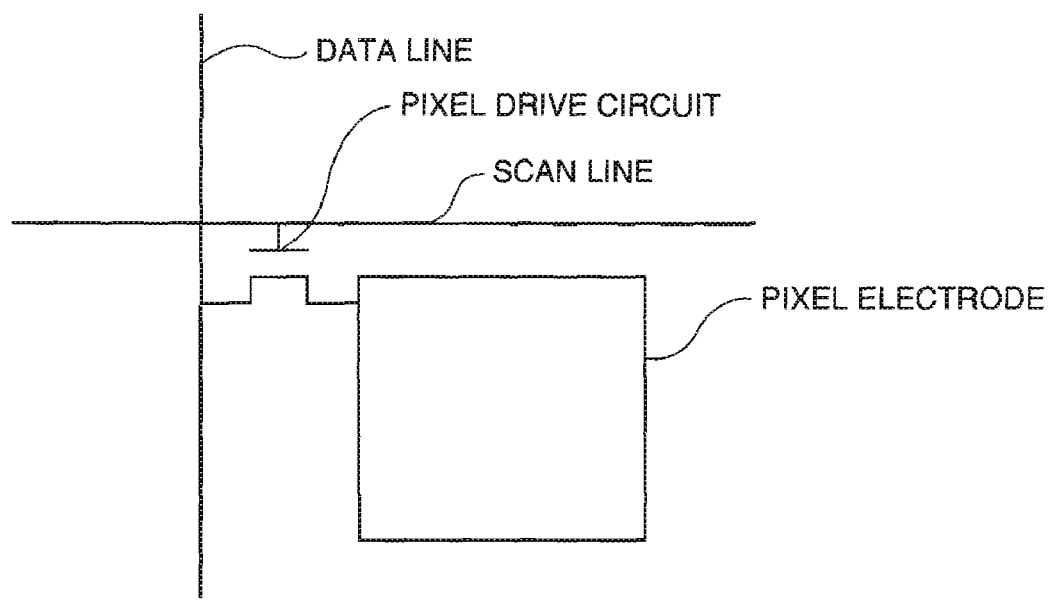
FIGS. 3A and 3B are schematic views showing examples of an active matrix substrate applying the wiring substrate according to an embodiment of the invention.
Figure 3B:
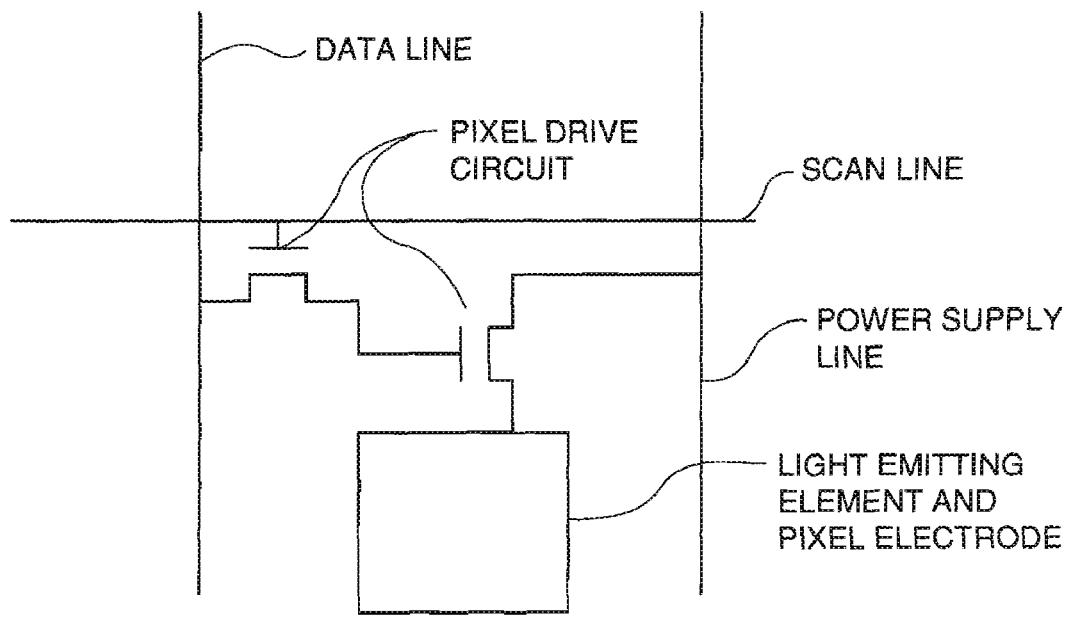

The wiring substrate 100 can be applied to, for example, an active matrix substrate shown in FIG. 3. FIG. 3A shows an example of an active matrix substrate used for a liquid crystal device, and FIG. 3B shows an example of an active matrix substrate used for an organic EL (electroluminescence) device. In this case, the first wiring 102 typically corresponds to the scan line, and the second wiring 103 typically corresponds to the data line.

Note that the material of the resist 106 is preferably required to have an extremely higher etching rate in comparison with the first wiring 102 or the insulating film 104 and also to have enough resistance against the heat or the plasma applied in forming the insulating, film. In the case in which, for example, metal such as Al, Cu, Ta, Cr, W or Mo, silicide, ITO (Indium Tin Oxide) or the like is used for the first wiring 102, and silicon dioxide ($SiO_2$), silicon nitride (SiN) or the like is used for the insulating film 104 using a CVD method or a sputtering method, a typical photo resist material, polyimide, polysilazane, or photosensitive materials of these materials can be used as the material of the resist 106.

Second Embodiment

Figure 4A:
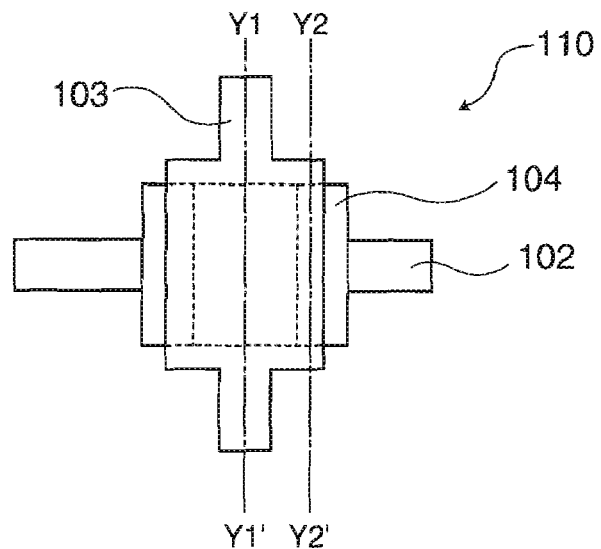
FIG. 4A is a top view of a wiring substrate according to an embodiment of the invention.
Figure 4B:
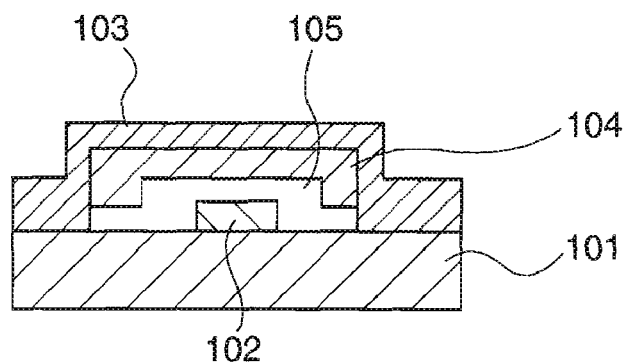
FIG. 4B is a cross-sectional view along the Y1-Y1' line in FIG. 4A.
Figure 4C:
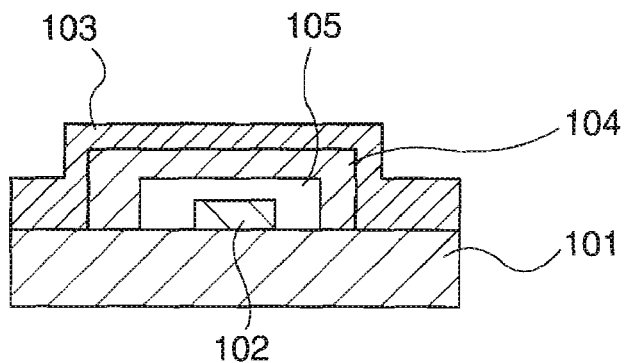
FIG. 4C is a cross-sectional view along the Y2-Y2' line in FIG. 4A.

FIGS. 4A through 4C are views schematically showing the structure of a wiring substrate 110 according to a second embodiment of the invention. FIG. 4A is a top view of the wiring substrate 110. FIG. 4B is a cross-sectional view along the Y1-Y1' line in FIG. 4A. FIG. 4C is a cross-sectional view along the Y2-Y2' line in FIG. 4A. The difference from the FIGS. 1A and 1B is that the second wiring 103 is formed with a greater width than the width of the empty space 105.

The overlapping section of the first wiring 102 with the second wiring 103 is isolated with the double layer structure composed of the insulating film 104 and the empty space 105 in the wiring substrate 100 shown in FIGS. 1A and 1B. In contrast in the wiring substrate 110, there are two sections, namely a section where the first wiring 102 and the second wiring 103 are isolated from each other with the double layer structure of the insulating film 104 and the empty space 105 as shown in FIG. 4B, and a section where the first wiring 102 and the second wiring 103 are isolated from each other only with the insulating film 104 as shown in FIG. 4C.

Advantages in adopting such a structure as the wiring substrate 110 will be described. Since the second wiring 103 is formed in the area isolated with the double layer structure so as to cross the opening sections in the both ends of the insulating film 104, namely the both ends of the empty space 105 as shown in FIG. 4B, in the case in which the second wiring 103 is formed using a liquid material, for example, the second wiring 103 may enter inside the empty space 105 in the manufacturing process to cause broken line in the second wiring 103. However, in the area isolated only with the insulating film 104 as shown in FIG. 4C, the broken line in the second wiring 103 hardly occurs. Therefore, the wiring substrate 110, as a whole, can make the broken line occur hardly.

Third Embodiment

Figure 5A:
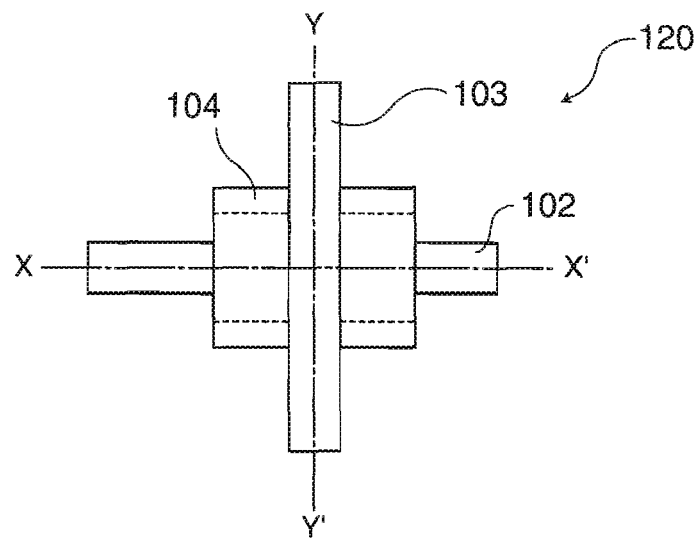
FIG. 5A is a top view of a wiring substrate according to an embodiment of the invention.
Figure 5B:
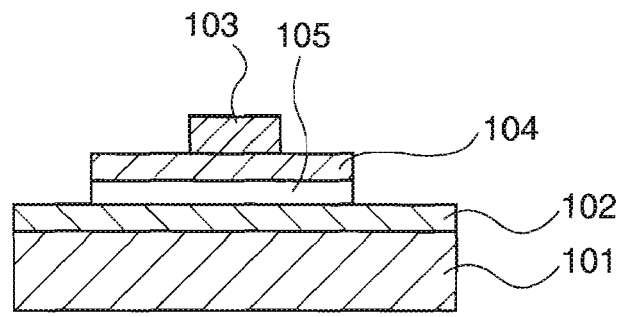
FIG. 5B is a cross-sectional view along the X-X' line in FIG. 5A.
Figure 5C:
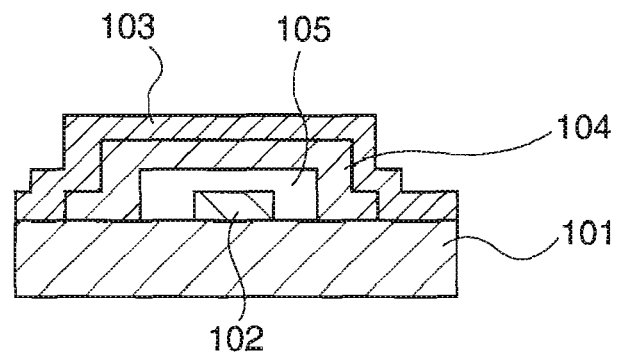
FIG. 5C is a cross-sectional view along the Y-Y' line in FIG. 5A.

FIGS. 5A through 5C are views schematically showing the structure of a wiring substrate 120 according to a third embodiment of the invention. FIG. 5A is a top view of the wiring substrate 120. FIG. 5B is a cross-sectional view along the X-X' line in FIG. 5A. FIG. 5C is a cross-sectional view along the Y-Y' line in FIG. 5A. The difference from one shown in FIGS. 1A and 1B is a direction in which the empty space 105 is formed.

Although in the embodiment shown in FIGS. 1A and 1B, the empty space 105 is provided along the direction in which the second wiring 103 extends, in the wiring substrate 120 the empty space 105 is provided in a direction perpendicular to the direction in which the second wiring 103 extends as shown in FIGS. 5A through 5C. Since the second wiring 103 does not cross the opening sections in the both ends of the insulating film 104, namely the both ends of the empty space 105, the broken line in the second wiring 103 becomes hard to occur.

Figure 6:
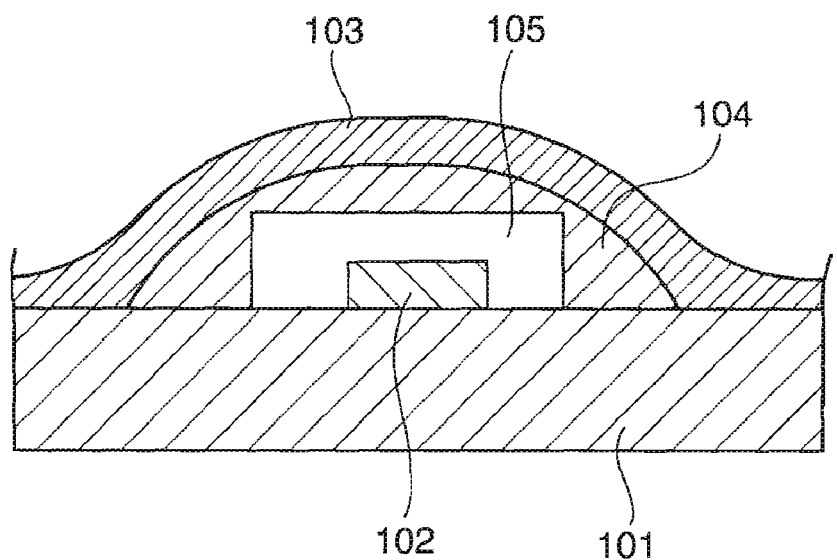
FIG. 6 is a cross-sectional view showing the structure of the wiring substrate according to an embodiment of the invention provided with an insulating film formed by an inkjet method.

Note that the insulating film 104 is formed to have a mild shape by forming the insulating film 104 by an inkjet method, as shown in FIG. 6, and accordingly, the broken line in the second wiring 103 formed on the insulating film 104 can be made hard to occur. Still further, by forming the removable film 106 using the inkjet method, the process can be made simple, and accordingly, the manufacturing cost can be reduced.

Fourth Embodiment

Figure 7:
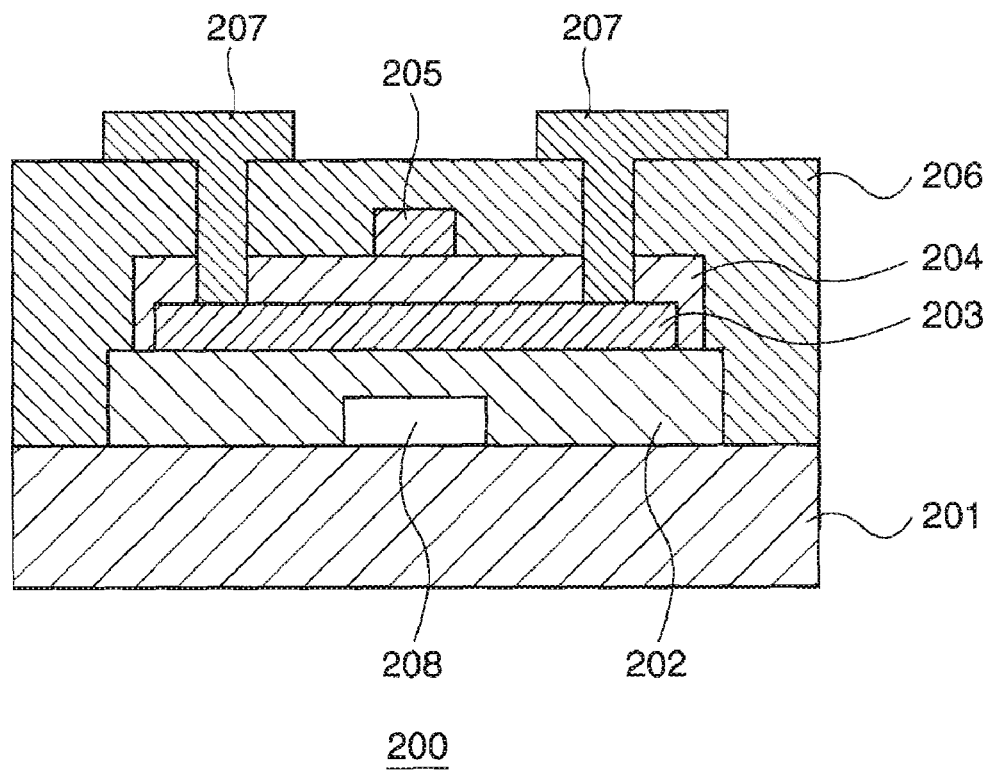
FIG. 7 is cross-sectional view showing the structure of a transistor applying the wiring substrate according to an embodiment of the invention.

An embodiment of applying the wiring substrate according to the invention to a semiconductor device (transistor) will hereinafter be explained. FIG. 7 is a cross-sectional view schematically showing the structure of the semiconductor device 200. The semiconductor device 200 is provided with a substrate (base body) 201, an insulating film (a second film) 202, a silicon film (a first film) 203, a gate insulating film 204, a gate electrode 205, an interlayer insulating film 206, and electrodes 207. The insulating film 202 has a hollow section, namely an empty space 208 is formed between the substrate 201 and the insulating film 202.

Then, a manufacturing process of the semiconductor device 200 will be explained with reference to FIGS. 8A through 8H. FIGS. 8A, 8C, 8E and 8G are top views of the semiconductor device 200, and FIGS. 8B, 8D, 8F and 8H are cross-sectional views of the semiconductor device 200, and FIGS. 8B, 8D, 8F and 8H are cross-sectional views along the respective X-X' lines in FIGS. 8A, 8C, 8E and 8G.

Firstly, as shown in FIGS. 8A and 8B, a resist (removable film) 209 is formed on the substrate 201. A photo resist made of, for example, novolak type resin can be used as the resist 209. The resist 209 is formed to have a thickness in a range of about several hundred nanometers through one micrometer. Note that, by irradiating with UV light in vacuo while heating at a temperature in a range of about 100 through 130° C. after patterning the resist 209, the heat resistance of the resist 209 can be improved, thus the resist can be prevented form deforming or decreasing in volume against a heat treatment up to about 300 through 400° C.

Subsequently, as shown in FIGS. 8C and 8D, the insulating film 202 is formed on the resist 209 by a coating process. In this case, as shown in FIG. 8C, the insulating film 202 is formed so that the both ends of the resist 209 are partially exposed. The insulating film 202 is formed by, for example, applying polysilazane on the substrate with a spin coat method, and then calcining it at a temperature in a range of 300 through 400° C. for about an hour in an oxygen or moisture environment.

Subsequently, as shown in FIGS. 8E and 8F, the resist 209 is removed using a resist remover liquid to form the empty space 208. The resist remover liquid enters also a part under the insulating film 202, while solving the resist 209 not covered with the insulating film 202, to completely remove the resist 209. As shown in FIG. 8C, since the both ends of the resist 209 are arranged to be partially exposed from the insulating film 202, the empty space 208 has a structure having ports in directions along one axis like a tunnel.

Subsequently, as shown in FIGS. 8G and 8H, the silicon film 203 is formed on the insulating film 202. As shown in FIG. 8H, a double layer structure composed of the insulating film 202 and the empty space 208 is formed between the substrate 201 and the silicon film 203.

Note that a silicon wafer (single crystal semiconductor substrate) or a glass substrate (insulating substrate), for example, can be used as the substrate 201. In the case in which the silicon wafer is used as the substrate 201, a parasitic capacitance with the silicon film 203 can be reduced by forming the double layer structure between the substrate 201 and the silicon film 203. Further, in the case in which the glass substrate is used, impurities contained in the glass substrate can be prevented from dispersing in the silicon film 203.

Figure 9A:
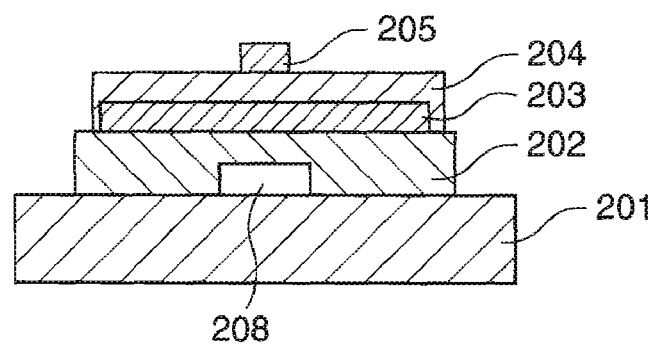
FIGS. 9A and 9B are views for explaining a method of manufacturing a transistor applying the wiring substrate according to an embodiment of the invention.
Figure 9B:
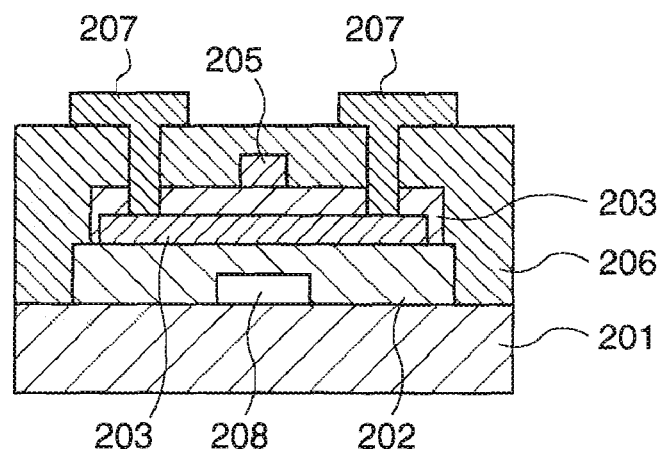

Subsequently, as shown in FIGS. 9A and 9B, the gate insulating film 204 is formed on the silicon film 203, and further, the gate electrode 205 is formed on the gate insulating film 204. As a method of forming the gate insulating film 204, a method of thermal-oxidizing the silicon film 203 or a method of using a CVD process of a coating process is used. The gate electrode 205 is formed by depositing a conductive film made of metal such Ta or metal silicide such as MoSi$_2$ using sputtering process and then pattering the conductive film.

Subsequently, impurities are ion-implanted using the gate electrode 205 as a mask to form a source/drain region.

And then, as shown in FIG. 9B, the interlayer insulating film 206 is formed, contact holes are opened, and then the electrodes 207 are formed. The interlayer insulating film 206 is formed using a CVD process or a coating process, and then a heat treatment is executed for making the interlayer insulating film 206 denser and for activating the implanted impurity ions.

The electrodes 207 are formed by sputtering and then patterning aluminum or the like after opening the contact holes.

Figure 10:
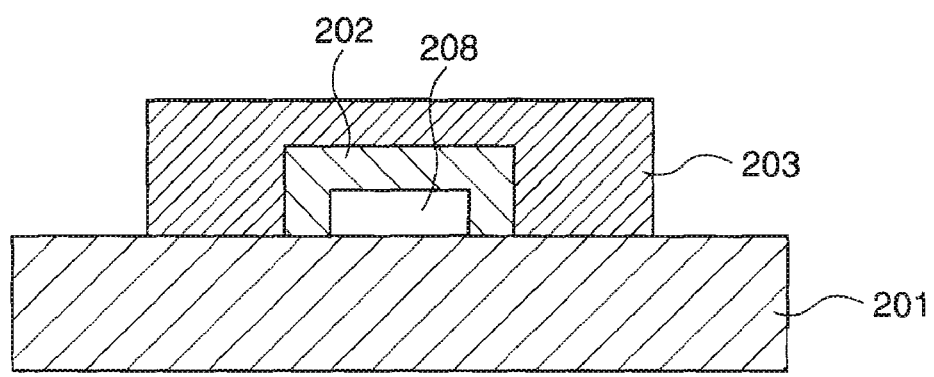
FIG. 10 is cross-sectional view showing an example of a transistor applying the wiring substrate according to an embodiment of the invention.

Note that, as another embodiment, the silicon film 203 can be formed so as to cover the outside of the insulating film 202, as shown in FIG. 10, and then patterned so that the silicon film 203 and the substrate 201 have contact with each other. In the case in which the substrate 201 is formed of silicon wafer, the silicon film 203 is arranged to have contact with the single crystal silicon at the end sections. Therefore, by executing a crystallizing treatment such as a thermal treatment or laser annealing, the crystal quality of the silicon film 203 can be improved. The silicon film 203 can even be substantially single-crystallized as a whole by optimizing the conditions of the crystallizing process. Further, by going through the processes shown in FIGS. 9A and 9B, a transistor having a preferable performance can be formed. In this case, since the silicon substrate and the silicon film 203 form the double layer structure composed of the empty space and the insulating film, which has a lower dielectric constant compared to conventional SOI substrates, thus the transistor circuit formed therewith can operate at a higher speed.

Further, as still another embodiment, a method of manufacturing a semiconductor device having a trench structure is explained with reference to FIGS. 11A through 11H. FIGS. 11A, 11C, 11E and 11G are top views of a semiconductor element, and FIGS. 11B, 11D, 11F and 11H are cross-sectional views along the respective X-X' lines in FIGS. 11A, 11C, 11E and 11G.

Firstly, as shown in FIGS. 11A and 11B, a resist 209 is formed on the substrate 201, and further a trench 210 is formed. The trench 210 is a structure for separating the semiconductor device from the environment.

Subsequently, as shown in 11C and 11D, the insulating film 202 is formed on the resist 209 by a coating process, and at the same time, an insulating film 211 is formed so as to fill in the trench 210.

Subsequently, as shown in FIGS. 11E and 11F, the resist 209 is removed using a resist remover liquid to form the empty space 208. In this case, although the insulating film 211 is also exposed to the remover liquid, the insulating film 211 is not completely removed because the insulating film 211 is very thick. Further, the trench 210 is provided with another insulating film in the succeeding gate insulating film forming process.

Subsequently, as shown in FIGS. 11G and 11H, the silicon film 203 is formed on the insulating film 202.

After then, by going through the process shown in FIGS. 9A and 9B, the transistor having the trench structure can be obtained.

Figure 12A:
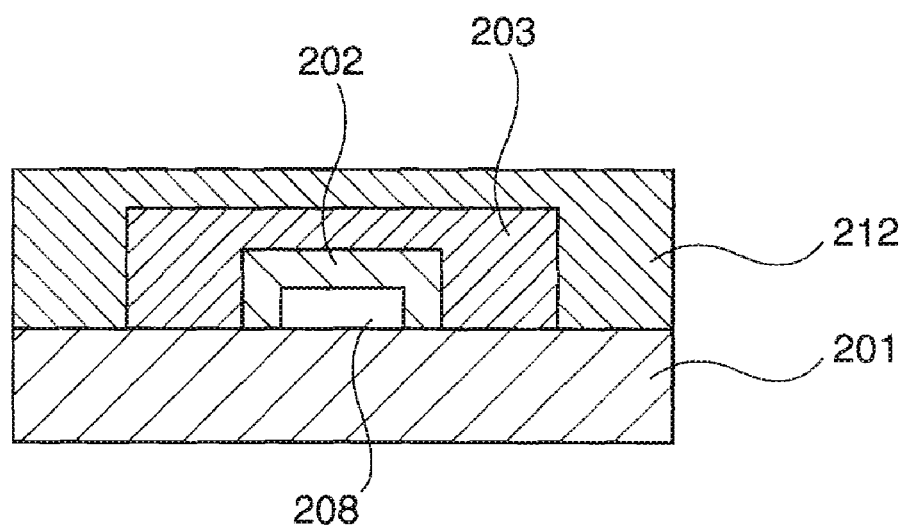
FIGS. 12A and 12B are cross-sectional views showing an example of a transistor applying the wiring substrate according to an embodiment of the invention.
Figure 12B:
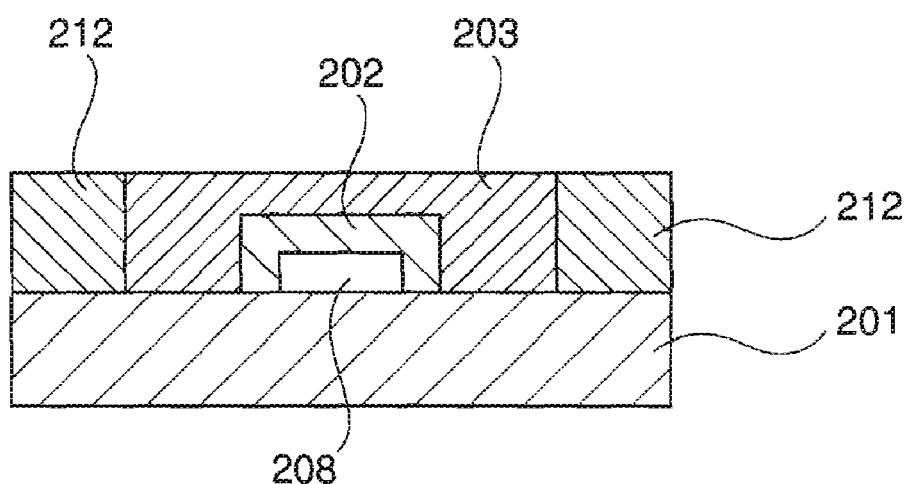

Further, FIGS. 12A and 12B are views showing a process for planarizing the semiconductor device. After forming the silicon film 203, as shown in FIG. 12A, polysilazane is applied and then calcined in an oxygen or moisture environment to form an insulating film 212. The thickness of the film here is preferably equal to or a little thicker than the step formed by the silicon film 203.

Subsequently, as shown in FIG. 12B, a whole surface etching is executed to expose the silicon film 203.

Further, the gate insulating film 204 is formed using a method of thermal-oxidizing the silicon film 203 or a method of using a CVD process of a coating process. In this case, since the silicon film 203 is exposed on the surface as shown in FIG. 12B, a film superior in the interfacial quality between the gate insulating film 204 and the silicon film 203 can be formed.

Note that the insulating film 212 can be used as a part of the gate insulating film 204. By executing the thermal oxidizing process in a condition shown in FIG. 12A, the oxide film is formed on the surface of the silicon film 203, thus the gate insulating film superior in the interfacial quality can be formed. In this case, the gate insulating film 204 has the double layer structure composed of the thermal-oxidized film and the coated insulating film 212.

Electro-Optic Device

Figure 13:
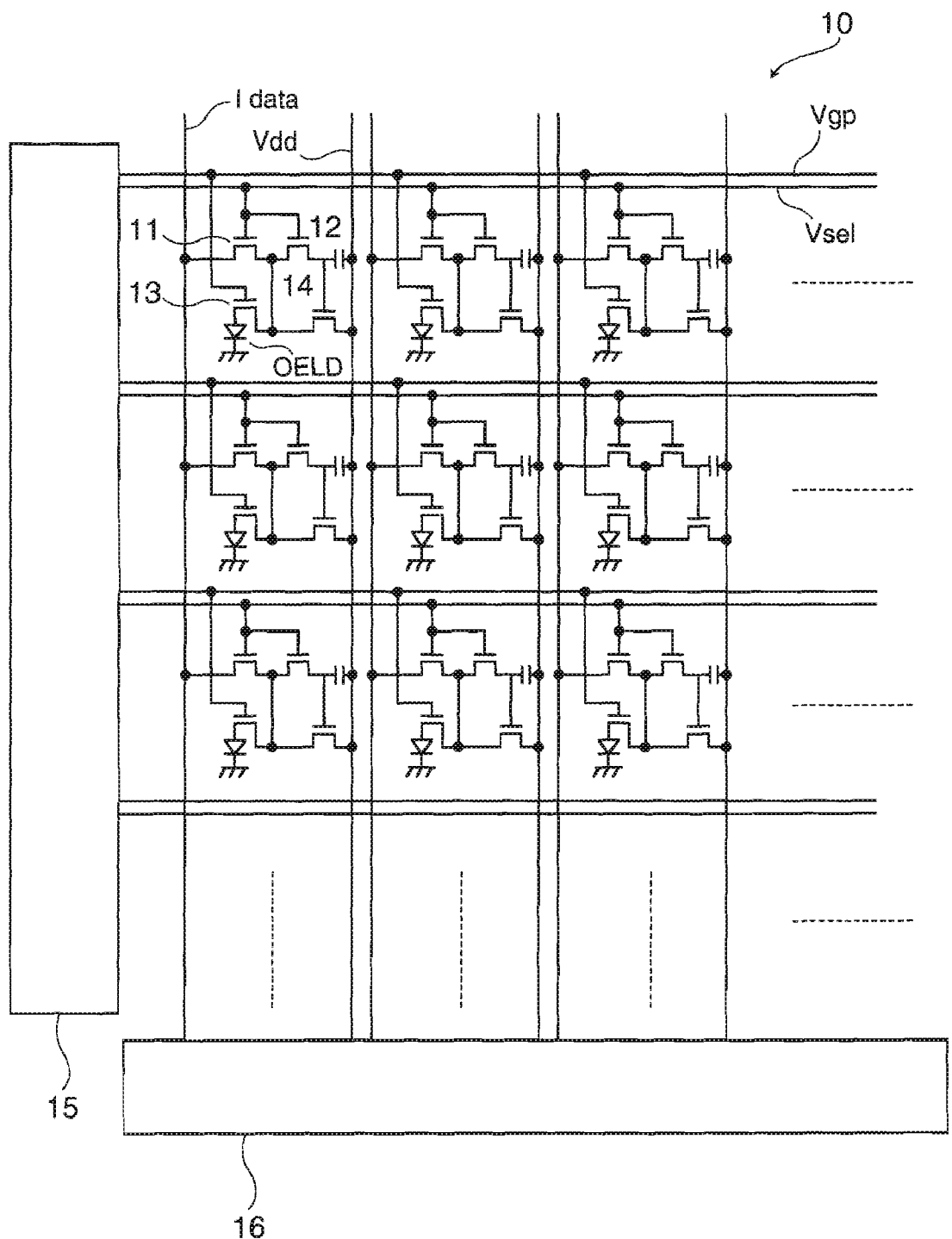
FIG. 13 is a circuit diagram of an organic EL device as an embodiment of an electro-optic device according to the invention.

FIG. 13 is a circuit diagram of an organic EL device 10 as an embodiment of an electro-optic device according to the invention. A pixel circuit provided to each of the pixel areas is composed of a light emitting layer OELD capable of emitting light by the electroluminescence effect, TFTs 11 through 14 forming a control circuit for driving the light emitting layer OELD and so on. Meanwhile, each of drive circuits 15 and 16 formed in drive circuit areas is composed of a plurality of TFTs (not shown) having the configurations described above. Scan lines Vsel and emission control lines Vgp are supplied from the drive circuit 15 to the corresponding pixel circuits, and data lines Idata and power supply lines Vdd are supplied from the drive circuit 16 to the corresponding pixel circuits. It is arranged that light emission by the corresponding light emitting layer OELD can be controlled by controlling the scan lines Vsel and the data lines Idata. Note that the drive circuit described above is one example of a circuit for using the electroluminescent elements as the light emitting elements, and other circuit configurations can also be adopted.

Electric Apparatus

FIGS. 14A through 14D are schematic views showing examples of an electric apparatus according to the invention.

Figure 14A:
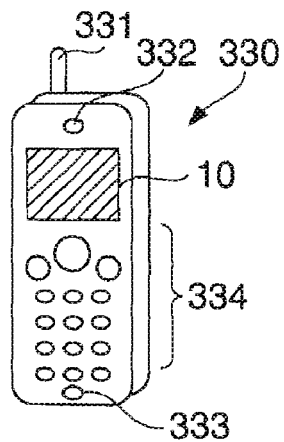
FIGS. 14A through 14D are schematic views showing examples of an electric apparatus according to the invention.

FIG. 14A shows a cellular phone manufactured by the manufacturing method according to the invention, and the cellular phone 330 is equipped with an electro-optic device (a display panel) 10, an antenna section 331, an audio output section 332, an audio input section 333 and an operating section 334. The invention is applied to, for example, manufacturing of a semiconductor device forming a pixel circuit and a drive circuit in the display panel 10.

Figure 14B:
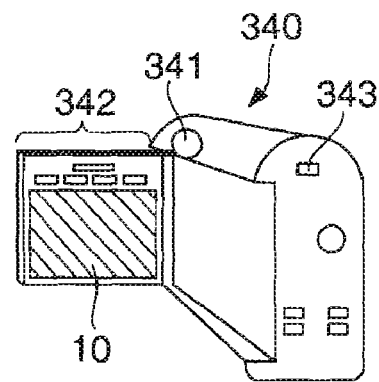

FIG. 14B shows a video camera manufactured by the manufacturing method according to the invention, and the video camera 340 is equipped with an electro-optic device (a display panel) 10, an image receiver section 341, an operating section 342 and an audio input section 343. The invention is applied to, for example, manufacturing of a semiconductor device forming a pixel circuit and a drive circuit in the display panel 10.

Figure 14C:
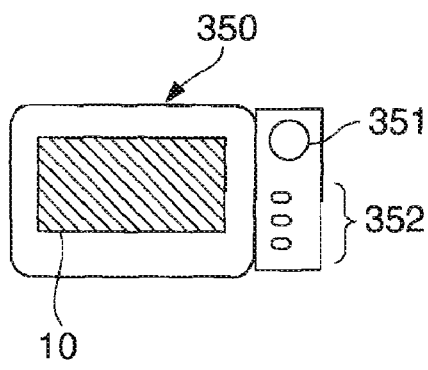

FIG. 14C shows an example of a portable personal computer manufactured by the manufacturing method according to the invention, and the portable personal computer 350 is equipped with an electro-optic device (a display panel) 10, a camera section 351 and an operating section 352. The invention is applied to, for example, manufacturing of a semiconductor device forming the display panel 10.

Figure 14D:
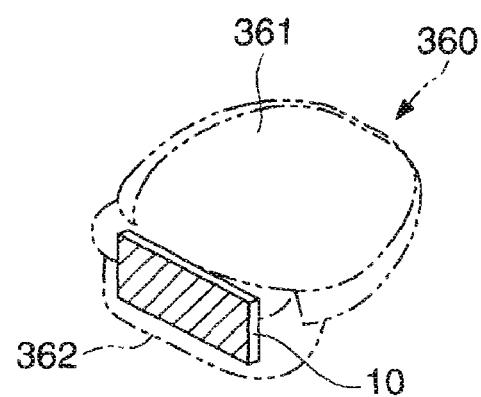

FIG. 14D shows an example of a head mount display manufactured by the manufacturing method according to the invention, and the head mount display 360 is equipped with an electro-optic device (a display panel) 10, a belt section 361 and an optical system storage 362. The invention is applied to, for example, manufacturing of a semiconductor device forming the display panel 10.

The invention is not limited to the embodiments described above, but can be applied to manufacturing of every electronic device. It can also be applied to, for example, a facsimile machine having a display function, a viewfinder of a digital camera, a portable TV, a DSP device, a PDA, an electronic organizer, an electronic bulletin board, a display for advertisement, an IC card, and so on. Note that the invention is not limited to the embodiment described above, but can be put into practice with various modifications or changes within the scope or the spirit of the invention. Further, although TFTs (thin film transistors) are exemplified as an example of the circuit element in the embodiments described above, it is obvious that the invention can preferably be applied to other circuit elements.

What is claimed is:

1. A method of manufacturing a semiconductor device, comprising:
    forming a removable film on a semiconductor substrate;
    forming an insulating film covering the removable film after the forming of the removable film, such that a part of the removable film protrudes from the insulating film in a plan view and a part of the insulating film contacts the semiconductor substrate;
    forming an empty space between the semiconductor substrate and the insulating film by dipping the removable film in a remover liquid to remove the removable film after the forming of the insulating film;
    forming a semiconductor film on the insulating film after the forming of the empty space so that a first part of the semiconductor film is positioned above the empty space and a second part of the semiconductor film touches a surface of the semiconductor substrate; and
    forming a crystallized semiconductor film after the forming of the semiconductor film.

2. A method of manufacturing an electro-optic device, comprising the method of manufacturing a semiconductor device according to claim 1.

3. A method of manufacturing an electric apparatus, comprising the method of manufacturing the electro-optic device according to claim 2.

4. The method of manufacturing a semiconductor device according to claim 1, the removable film having a rectangular shape in a plan view.

5. The method of manufacturing a semiconductor device according to claim 1, the forming of the insulating film including applying a liquid material onto the removable film.

6. The method of manufacturing a semiconductor device according to claim 1, the forming of the insulating film including applying a liquid material onto the removable film, the liquid material including a polysilazane.

7. The method of manufacturing a semiconductor device according to claim 1, the forming of the removable film including forming a resist on the substrate.

8. The method of manufacturing a semiconductor device according to claim 1, the forming of the removable film including forming a resist on the substrate, the resist including a novolak type resin, and the forming of the insulating film including applying a liquid material onto the removable film, the liquid material including a polysilazane.

9. A method of manufaca semiconductor device according to claim 1, the semiconductor substrate being a silicon wafer.

10. A method of manufacturing a semiconductor device according to claim 1, the semiconductor film being a silicon film.

11. A method of manufacturing a semiconductor device, comprising:
    forming a removable film on a semiconductor substrate;
    forming an insulating film covering the removable film after the forming of the removable film, such that a first part of the removable film and a second part of the removable film protrudes from the insulating film in a plan view and a part of the insulating film contacts the semiconductor substrate;
    forming an empty space between the semiconductor substrate and the insulating film by dipping the removable film in a remover liquid to remove the removable film after the forming of the insulating film;
    forming a semiconductor film on the insulating film after the forming of the empty space so that a first part of the semiconductor film is positioned above the empty space and a second part of the semiconductor film touches a surface of the semiconductor substrate; and
    forming a crystallized semiconductor film after the forming of the semiconductor film.

* * * * *